United States Patent
Lisart et al.

(10) Patent No.: US 7,847,581 B2
(45) Date of Patent: Dec. 7, 2010

(54) DEVICE FOR PROTECTING AN INTEGRATED CIRCUIT AGAINST A LASER ATTACK

(75) Inventors: Mathieu Lisart, Aix en Provence (FR); Vincent Pouget, Talence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 12/416,663

(22) Filed: Apr. 1, 2009

(65) Prior Publication Data
US 2009/0251168 A1 Oct. 8, 2009

(30) Foreign Application Priority Data
Apr. 3, 2008  (FR) .................................. 08 52215

(51) Int. Cl.
*H03K 19/00* (2006.01)
(52) U.S. Cl. .................. 326/8; 326/9; 326/14; 326/101
(58) Field of Classification Search ........................ None
See application file for complete search history.

(56) References Cited

U.S. PATENT DOCUMENTS 7,473,958 B2 * 1/2009 Wagner et al. .............. 257/316
2002/0130248 A1 9/2002 Bretschneider et al.
2006/0081912 A1 4/2006 Wagner et al.
2007/0171588 A1 * 7/2007 Gehle et al. .................... 361/56

FOREIGN PATENT DOCUMENTS

DE    1020040096 A1    6/2005

OTHER PUBLICATIONS

French Search Report dated Dec. 11, 2008 from French Patent Application No. 08/52215.

* cited by examiner

*Primary Examiner*—Anh Q Tran
(74) *Attorney, Agent, or Firm*—Lisa K. Jorgenson; James H. Morris; Wolf, Greenfield & Sacks, P.C.

(57) ABSTRACT

An integrated circuit including a substrate of a semiconductor material having first and second opposite surfaces and including active areas leveling the first surface. The integrated circuit includes a device of protection against laser attacks, the protection device includes at least one first doped region extending between at least part of the active areas and the second surface, a device for biasing the first region, and a device for detecting an increase in the current provided by the biasing device.

16 Claims, 2 Drawing Sheets

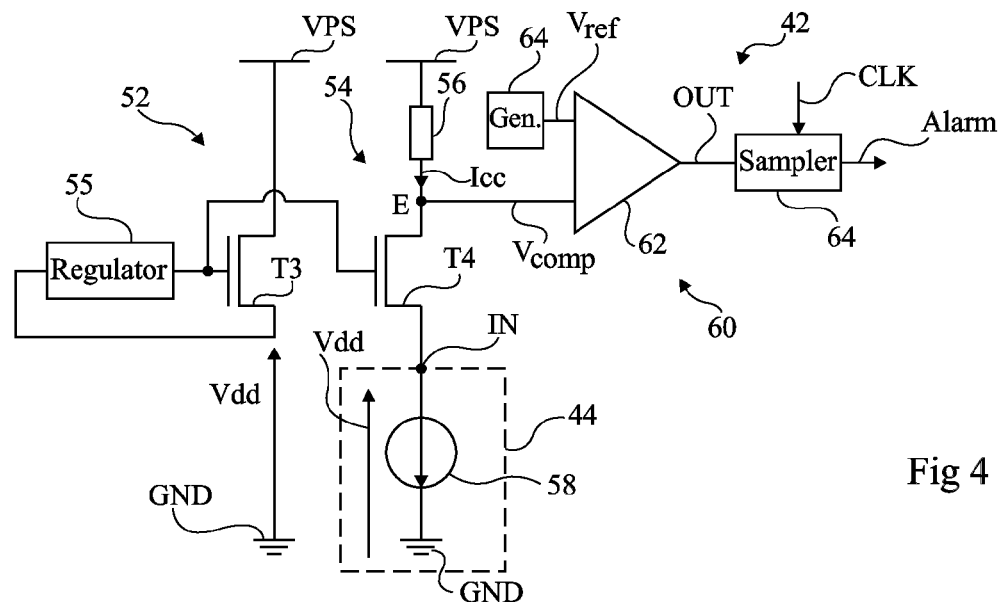
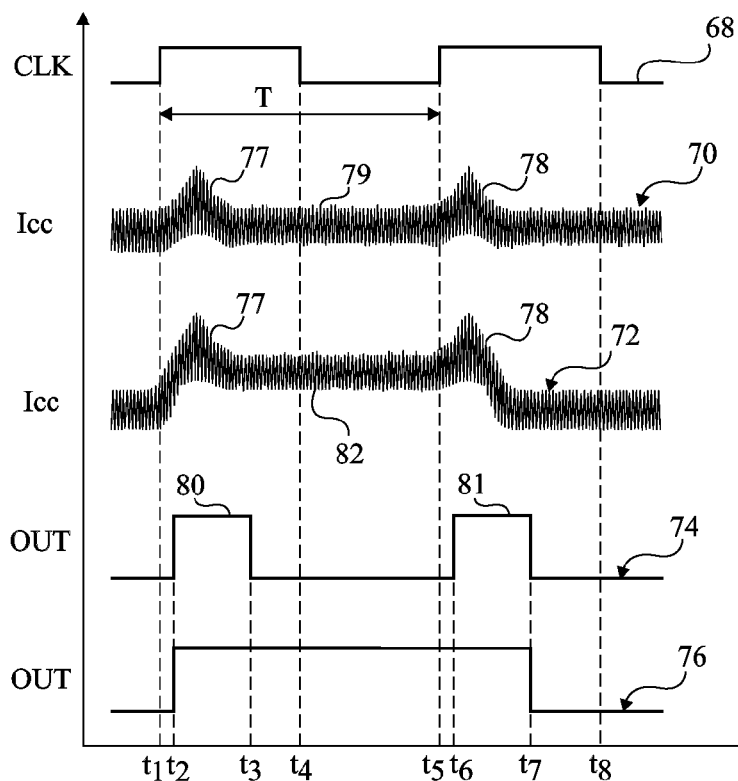
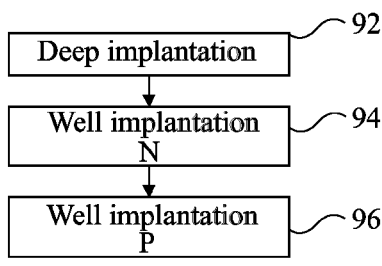
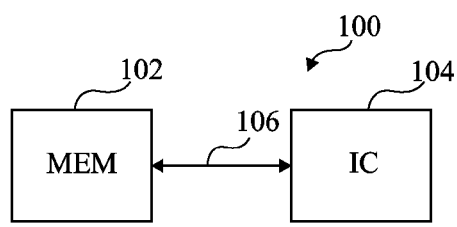

DEVICE FOR PROTECTING AN INTEGRATED CIRCUIT AGAINST A LASER ATTACK

CROSS REFERENCE TO RELATED APPLICATIONS

This application claims the priority benefit of French patent application number 08/52215, filed on Apr. 3, 2008, entitled "DEVICE FOR PROTECTING AN INTEGRATED CIRCUIT AGAINST A LASER ATTACK," which is hereby incorporated by reference to the maximum extent allowable by law.

BACKGROUND OF THE INVENTION

1. Field of the Invention

The present invention relates to devices for protecting an integrated circuit against external attacks.

2. Discussion of the Related Art

It may be desirable to protect an integrated circuit against external attacks aiming, for example, at disturbing or even hindering the normal operation of the integrated circuit. An example of attack comprises scanning the front surface or the rear surface of the integrated circuit with a laser, especially a pulse laser. Such a method can enable to modify data stored in memories of the integrated circuit or to modify the logic states or the durations of signals transmitted along conductive tracks of the integrated circuit.

The integrated circuit may comprise a protection device which enables detecting that a laser attack is occurring. The protection device may then control the stopping of the integrated circuit, the deleting of confidential data, etc.

By way of example, the device of protection against laser attacks may comprise several electronic components, for example, photodiodes, memory elements of flip-flop type, formed in the integrated circuit. These components are sensitive to the light beam of the laser and behave as sensors allowing the presence of the laser beam to be detected.

However, such a protection device only enables detection a laser attack if the laser beam directly reaches one of the sensors of the protection device. To ensure a high probability of detection of an attack during a laser scan across an entire region of an integrated circuit, it is necessary to provide a large number of sensors. This necessitates an increase in the surface area of the integrated circuit dedicated to the protection device and thus in the integrated circuit manufacturing cost.

SUMMARY OF THE INVENTION

At least one embodiment of the present invention aims at a device for protecting an integrated circuit against laser attacks, enabling protection of a significant portion of the integrated circuit without requiring a significant increase in the integrated circuit surface area.

According to another object, the protection device enables the detection of attacks both by continuous laser and by pulse laser.

Thus, at least one embodiment of the present invention provides an integrated circuit comprising a substrate of a semiconductor material having first and second opposite surfaces and comprising active areas leveling the first surface. The integrated circuit comprises a device of protection against laser attacks. The protection device comprises at least one first doped region located in the part of the substrate extending between the active areas and the second surface, a device for biasing the first region and a device for detecting an increase in the current provided by the biasing device.

According to an embodiment of the present invention, the first doped region is of a first conductivity type and the active areas comprise a network of second doped regions of the first conductivity type and of third doped regions of a second conductivity type, each second and third region extending into the substrate from the first surface, the first region extending at least at the level of some of the second and third regions.

According to an embodiment of the present invention, the integrated circuit comprises a fourth region of the second conductivity type extending into the substrate from the first surface, at least partially surrounding the active areas, at the level of which the first region extends, and intended to be connected to an additional biasing device of the substrate.

According to an embodiment of the present invention, the integrated circuit comprising electronic components at least partly in the active areas, the components being clocked by a clock signal and the detection device comprises a first unit for providing a first signal representative of said current, a second unit for providing a second signal which depends on the comparison of the first signal and of a third reference signal, and a unit for sampling the third signal at times outside of a non-zero time period following each rising edge of the clock signal.

According to an embodiment of the present invention, the biasing device comprises a MOS transistor and the first unit comprises a resistor in series with the transistor.

According to an embodiment of the present invention, the sampling device is capable of sampling the third signal on each falling edge of the clock signal.

Another embodiment of the present invention provides an electronic system comprising a first integrated circuit such as described hereabove, a second integrated circuit separate from the first integrated circuit, and at least one connection connecting the first integrated circuit to the second integrated circuit.

Another embodiment of the present invention provides a method for manufacturing an integrated circuit comprising a substrate of a semiconductor material, having first and second opposite surfaces and comprising a device of protection against laser attacks. The method comprises the steps of forming at least one first region doped deep inside the substrate, forming active areas extending in the substrate from the first surface, the first region being located in the part of the substrate extending between the active areas and the second surface, forming a device for biasing the first region, and forming a device for detecting an increase in the current provided by the biasing device.

According to an embodiment of the present invention, the method comprises the steps of forming the first region by a first implantation of dopants of a first conductivity type at a first power and of forming the active areas by a network of second doped regions of the first conductivity type and of third doped regions of a second conductivity type, the first region extending at least at the level of some of the second and third regions, the second regions being formed by a second implantation of dopants of the first conductivity type at a second power lower than the first power.

The foregoing objects, features, and advantages of the present invention will be discussed in detail in the following

BRIEF DESCRIPTION OF THE DRAWINGS

FIG. 4 shows an embodiment of a detection circuit of the protection device according to the present invention;

FIG. 5 is a timing diagram of signals characteristic of the operation of the detection circuit of FIG. 4;

FIG. 6 is a block diagram illustrating an example of a method for manufacturing the protection device according to the present invention; and FIG. 7 schematically shows an example of an electronic system comprising an integrated circuit provided with the protection device according to the present invention.

DETAILED DESCRIPTION

Figure 1:
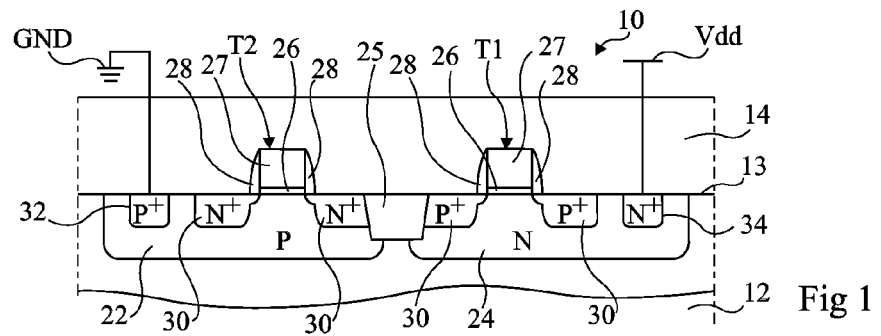
FIG. 1 is a simplified cross-section view of an example of a conventional integrated circuit.

For clarity, the same elements have been designated with the same reference numerals in the different drawings and, further, as usual in the representation of integrated circuits, the various drawings are not to scale. In the following description, the portions of the integrated circuit substrate at the level of which electronic components such as transistors, diodes, etc. are formed are called active areas of the integrated circuit. More specifically, in the context of the present invention, integrated circuits for which the active areas extend into the substrate from a surface of the substrate only down to part of the substrate depth are considered.

FIG. 1 is a simplified cross-section view of an example of a conventional integrated circuit. Integrated circuit 10 comprises a substrate 12 of a semiconductor material. It is, for example, an undoped or P-type doped single-crystal silicon substrate 12. Substrate 12 comprises a surface 13 covered with a stack of insulating layers (only one insulating layer 14 being shown in FIG. 1). Circuit 10 comprises a P-type doped region 22 and an N-type doped region 24 extending into substrate 12 from surface 13. Regions 22 and 24 form wells and are laterally separated from each other by an insulating region 25 formed in substrate 12, for example, according to a shallow trench isolation or STI method. Circuit 10 may comprise several wells 22 and 24, for example, arranged in rows and columns. Electric components are provided at the level of wells 22, 24. As an example, a P-channel transistor T1 has been shown at the level of well 24 and an N-channel transistor T2 has been shown at the level of well 22. Conventionally, each transistor T1, T2 comprises an insulating portion 26 covering substrate 12 and forming the gate insulator of transistor T1, T2, a portion 27 of a semiconductor material covering insulating portion 26 and forming the gate of transistor T1, T2, spacers 28 surrounding gate 27 and doped regions 30 extending into substrate 12, arranged on either side of gate 27 and forming the source and drain regions of transistor T1, T2.

A P-type region 32, more heavily doped than region 22, extends into region 22 from surface 13. Region 32 is connected to a source of a first reference voltage, for example, ground GND, ensuring the biasing of well 22 and of substrate 12. An N-type region 34, more heavily doped than region 24, extends into region 24 from surface 13. Region 34 is connected to a source of a second reference voltage, for example, Vdd, greater than first reference voltage GND and ensuring the biasing of well 24.

An embodiment of the present invention comprises providing in the integrated circuit substrate, between the rear surface of the integrated circuit and the active areas, at least one protection shield formed of a doped region formed deep inside the substrate. The protection shield is capable of capturing electrons photogenerated mainly at the junction between the doped region forming the protection shield and the adjacent substrate during the passing of a laser beam. A detection circuit, connected to the protection shield, is capable of detecting a variation of an electric quantity due to the passing of a laser beam. In particular, the variation of the electric quantity may correspond to a current variation. The detection of an attack may cause the transmission of an alert signal that can cause the stopping of the integrated circuit, the deleting of confidential data, etc. The present embodiment is advantageously adapted to the detection of an attack both by a continuous laser or by a pulse laser.

Figure 2:
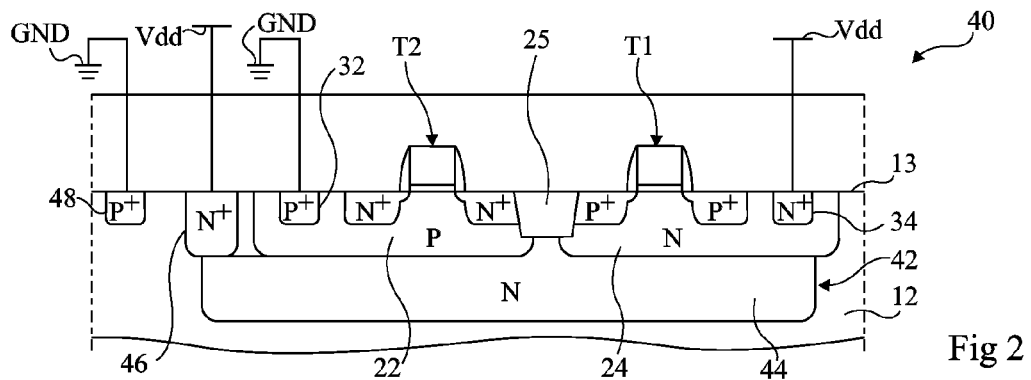
FIG. 2 is a simplified cross-section view of an embodiment of an integrated circuit provided with a protection device according to the present invention.

FIG. 2 is a simplified cross-section view of an embodiment of an integrated circuit 40 comprising a protection device 42 according to the present invention. Integrated circuit 40 comprises the elements of circuit 10 of FIG. 1. Protection device 42 comprises an N-type doped region 44 formed in substrate 12 under wells 22, 24. Generally, region 44 may have the shape of a shield which extends under certain wells 22, 24 of the integrated circuit. As will be described in further detail hereafter, protection device 42 also comprises a detection circuit, not shown in FIG. 2, and connected to protection shield 44.

Protection shield 44 may be in contact with well 24. The biasing of protection shield 44 may then be performed via well 24 connected to the source of voltage Vdd. An N-type region 46 may extend into substrate 12 from surface 13 to region 44. Region 46 may then be connected to the source of voltage Vdd to bias protection shield 44.

The biasing of well 22 is performed by region 32 connected to ground GND. Since well 22 can be electrically isolated from the rest of substrate 12, the biasing of substrate 12 may have to be performed separately from the biasing of well 22. For this purpose, a P-type doped region 48, more heavily doped than substrate 12 and which extends into substrate 12 from surface 13 may be provided. Region 48 is connected to ground GND to bias substrate 12.

Figure 3:
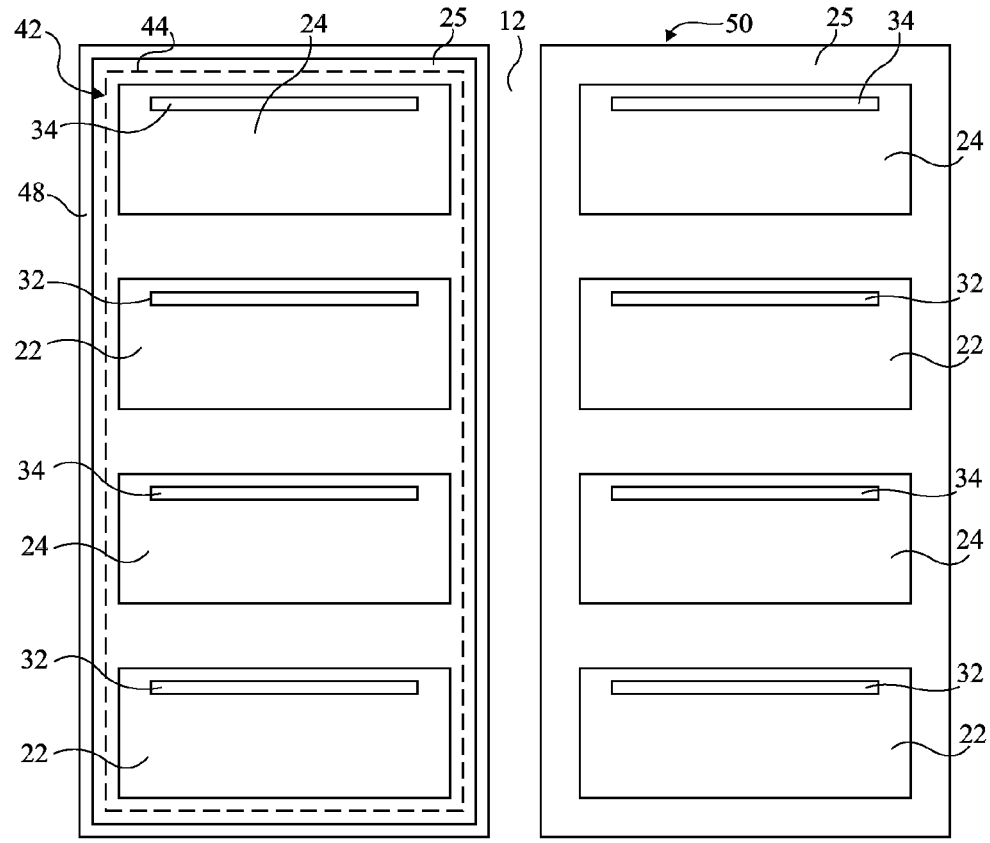
FIG. 3 is a simplified bottom view of a variation of the integrated circuit of FIG. 2.

FIG. 3 shows a simplified bottom view of an integrated circuit 50 corresponding to a variation of integrated circuit 40 of FIG. 2. In FIG. 3, the contour of wells 22, 24, and of insulating regions 25 has been schematically shown in full lines. Wells 22, 24 are distributed in FIG. 3 in two columns. The contour of protection shield 44 has been shown in dotted lines. Protection shield 44 extends only under wells 22, 24 of the column shown to the left in FIG. 3. The contour of region 48 has been shown in full lines. Region 48 has, for example, the shape of a ring surrounding wells 22, 24 protected by protection shield 44. The contour of regions 32 and 34 has been shown in full lines. The regions 32 associated with the wells 22 protected by screen 44 essentially ensure the biasing of wells 22. The regions 32 associated with the wells 22 unprotected by screen 44 ensure the biasing of these wells 22 and of substrate 12. As compared with circuit 40, circuit 50 does not comprise region 46. However, as a variation, the biasing of screen 44 may also be performed by one or several regions 46 in addition to wells 22. According to another variation, the biasing of screen 44 may be only performed by one or several regions 46.

FIG. 4 is a schematic diagram of an embodiment of protection device 42 in the case where integrated circuit 40 is a synchronous circuit. Conventionally, integrated circuit 40 comprises a main unit for providing reference voltage Vdd and secondary units for providing the reference voltage. Each secondary supply unit is associated with a portion of the integrated circuit, for example, a set of wells. As an example, each secondary supply unit ensures the biasing of the N-type doped wells with which it is associated. According to an embodiment of the present invention, the structure of the secondary supply unit associated with a set of wells protected by a protection shield is modified and a circuit for detecting a laser attack is associated with the modified secondary power supply unit.

In the present embodiment, main supply circuit 52 comprises an N-channel MOS transistor T3 having its drain connected to a source of a voltage VPS, greater than or equal to reference voltage Vdd, and having its source connected to an input of a regulation unit 55 (Regulator). The output of unit 55 biases the gate of transistor T3. Unit 55 is capable of varying the gate voltage of transistor T3 so that the voltage at the source of transistor T3 remains substantially constant and equal to Vdd. As an example, voltage Vdd is 1.3 volt and voltage VPS ranges between 2 and 5 volts. Each secondary supply unit, a single secondary supply unit 54 being shown in FIG. 4, comprises an N-channel MOS transistor T4 having its gate connected to the gate of transistor T3. The source of transistor T4 is connected to a terminal IN intended to be connected, among others, to the N-type wells of the portion of integrated circuit 40 associated with secondary supply unit 54. For a secondary supply unit connected to a portion of integrated circuit 40 unprotected by a protection shield 44, the drain of transistor T4 is directly connected to the source of voltage VPS.

According to the present embodiment, the secondary unit 54 associated with a portion of integrated circuit 40 having its wells 22, 24 protected by a protection shield 44 further comprises a resistor 56 having one terminal connected to the source of voltage VPS and its other terminal connected to the drain of transistor T4. A node located between resistor 56 and the drain of transistor T4 is designated with reference E. The current at node E is called Icc.

The block in dotted lines corresponds to protection shield 44. In the absence of a laser attack or between two pulses during a pulse laser attack, screen 44 is equivalent to a source of a zero current. When a laser beam reaches integrated circuit 40, protection shield 44 tends to capture electrons photogenerated mainly at the junction between region 44 and adjacent substrate 12. It is then equivalent to a current source 58 having one terminal connected to terminal IN and having its other terminal connected to ground GND. Current source 58 pulls an approximately constant non-zero current Ipulse for all the time that region 44 is exposed to the laser beam.

Detection circuit 60 comprises a comparator 62 having a first input connected to node E and receiving a signal Vcomp, for example, the voltage at node E. A second input of comparator 62 receives a reference signal Vref provided by a unit 64. Reference signal Vref for example corresponds to voltage VPS. Comparator 62 provides a signal OUT which may correspond to a two-state signal. As an example, signal OUT is in a high state when voltage Vcomp is smaller than Vref and is in a low state when voltage Vcomp is greater than or equal to Vref. Signal OUT is sampled by a sampler 64 clocked by a clock signal CLK associated with the circuit portion powered by secondary supply unit 54. Sampler 64 provides an alarm signal Alarm corresponding to a succession of sampled of values of signal OUT.

FIG. 5 is a timing diagram of signals characteristic of protection device 42 of FIG. 4. Call t1 to t8 successive times. Curve 68 shows clock signal CLK. Curves 70 and 72 show the variation of current Icc respectively in the absence and in the presence of a laser attack. Curves 74 and 76 show the variation of signal OUT respectively in the absence and in the presence of a laser attack. Clock signal CLK is a periodic signal of period T and for example corresponds to a square wave signal of duty cycle ½. As an example, period T of signal CLK is on the order of from a few nanoseconds to a few tens of nanoseconds. In the present embodiment, signal CLK has a rising edge at times t1 and t5 and a falling edge at times t4 and t8. Clock signal CLK may clock all or some of the electronic components protected by screen 44.

Conventionally, for a synchronous integrated circuit, current surges can be observed little after each rising edge of clock signal CLK. This translates as peaks 77, 78 on curves 70, 72 little after times t1 and t5. The duration of a peak is, for example, on the order of from 1 to a few nanoseconds.

In normal operation, protection shield 44 is electrically equivalent to a zero current source. Thereby, between two current surges 77, 78, current Icc fluctuates around the zero value (stage 79). When current Icc is substantially zero, the voltage at node E is substantially equal to VPS. Signal OUT then is in the low state. For each current surge peak 77, 78, the rise of current Icc causes a decrease in the voltage at node E due to the increase in the current flowing through resistor 56. Signal OUT then switches from the low level to the high level at time t2 (and at time t6). At the end of each current surge peak 77, 78, when current Icc becomes substantially zero again, the voltage at node E substantially rises to value VPS so that signal OUT switches to the low level at time t3 (and at time t7). In the absence of a laser attack, signal OUT corresponds to a substantially periodic succession of pulses 80, 81 of same period as signal CLK.

When the portion of integrated circuit 40 protected by protection shield 44 is submitted to a laser attack, protection shield 44 is electrically equivalent to source 58 of current Ipulse. Further, in the case of a pulse laser, protection shield 44 is equivalent to a zero current source between two laser pulses. In the present example, it is considered that a pulse of a laser is applied substantially between times t1 and t5. It can then be observed that after current surge peak 77, current Icc settles at a non-zero stage 82, substantially equal to current Ipulse, until the next current surge peak 78. Signal OUT, which has switched from the low state to the high state at time t2 at the beginning of current surge peak 77, remains in the high state until time t7, that is, the end of the next current surge peak 78, at which it switches back to the low state.

Switch 64 is controlled to sample signal OUT between times t3 and t6. In normal operation, signal OUT is in the low state between times t3 and t6. Thereby, if the sampled value Alarm of signal OUT is in the high state, this means that a laser attack is ongoing. The sampling time may be fixed from one clock cycle to the other or may vary from one clock cycle to the other. As an example, the sampling may be performed on each falling edge of clock signal CLK (times t4 and t8).

In the case where the sampling time is fixed from one clock cycle to the other, a pulse laser attack could be devised, in which the laser pulses would be synchronized with clock signal CLK so that the sampling time always occurs between two pulses, so that the attack is then not detected. Such an attack can in fact not be implemented, due to the natural fluctuations or jitter of the period of clock signal CLK, which translate as a variation in the period of the sampling times.

For an asynchronous integrated circuit, in the absence of a laser attack, current Icc generally comprises no peaks 77, 78, but has a level that can be substantially constant and non-zero. In this case, it is possible for detection circuit 42 not to comprise sampler 64. Reference voltage Vref is determined so that, in the absence of a laser attack, voltage Vcomp is greater than voltage Vref. Signal OUT then is, for example, at the low level. In a continuous or pulse laser attack, current level Icc rises. Reference voltage Vref is determined so that, in a laser attack, voltage Vcomp becomes smaller than voltage Vref. Signal OUT then switches to the high state. Thereby, the switching of signal OUT from the low state to the high state directly corresponds to the detection of a laser attack.

Generally, at least one embodiment of the present invention provides for detecting a durable increase of the current Icc provided by the biasing device. A durable increase means an increase extending longer than the duration of a synchronization pulse, as illustrated by a comparison of signals 70 and 72 of FIG. 5.

FIG. 6 shows a block diagram illustrating an example of a method for manufacturing protection shield 44 of protection device 42.

At a first step 92, single-crystal silicon substrate 12 which is, for example, P-type doped, is provided. A drive-in is then performed in substrate 12. As an example, the implantation is performed with phosphorus, with a dose on the order of $1.10^{13}$ atoms/cm2 and with a power on the order of 1.5 MeV. Region 44 is then formed, which extends into substrate 12 starting from a depth from 1 to a few micrometers, for example, 1.7 μm, from upper surface 13 of substrate 12.

At step 94, a shallower implantation is carried out to form N-type wells 24 and regions 46. As an example, the implantation is performed with phosphorus, with a dose on the order of $7.10^{12}$ atoms/cm2 and with a power on the order of 440 keV. This provides N-type regions 24, 46 which extend into substrate 12 from upper surface 13 down to depths from 1 to a few micrometers, for example, 1.7 micrometers. Regions 24, 46 extend sufficiently deeply into substrate 12 to ensure an electric continuity with screen 44.

At step 96, an implantation is carried out to form P-type wells 22. As an example, the implantation is performed with boron, with a dose on the order of $5.10^{12}$ atoms/cm2 and with a power on the order of 200 keV.

Certain integrated circuits may comprise an isolation shield formed of a doped region formed deep inside the substrate and extending under active areas of the substrate to electrically isolate them from electric disturbances originating from the substrate. These are for example integrated circuits comprising volatile memories, the isolation shield being, for example, provided at the memory cell level. In this case, the methods for manufacturing such integrated circuits comprise a drive-in step. The present embodiment according to the present invention can then be implemented for such integrated circuits without modifying their manufacturing process, the forming of protection shield 44 being carried out simultaneously to the forming of the isolation shield, protection shield 44 being formed at the level of the active areas of the integrated circuit to be protected against laser attacks and the isolation shield being formed at the level of the active areas of the integrated circuit to be isolated from the substrate.

FIG. 7 schematically shows an electronic circuit 100 comprising a memory 102 (MEM), for example, a volatile memory, comprising a protection device such as described previously. Electronic circuit 100 further comprises another integrated circuit 104 (IC), for example, an interface circuit, connected to memory 102 by a connection 106, for example for the writing of data into memory 102 or the reading of data stored in memory 102.

Different embodiments of the present invention have been described. Various alterations and modifications will occur to those skilled in the art. In particular, although the present invention has been described for an integrated circuit having a neutral or P-type doped substrate and in which protection shield 44 of protection device 42 corresponds to an N-type doped region, it should be clear that the present invention may apply to an N-type doped substrate or a substrate comprising, at its surface, an N-type doped layer. In this case, the cord corresponds to a P-type doped region formed deep inside the substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising a substrate having first and second opposite surfaces, a plurality of active areas leveling the first surface and including a plurality of wells, and a protection device configured to protect the integrated circuit against laser attacks, the protection device comprising:
    at least one first doped region located between the active areas and the second surface, wherein the at least one first doped region extends below at least two of the plurality of wells formed in the substrate;
    a biasing device configured to bias the at least one first doped region; and
    a device configured to detect a durable increase in the current provided by the biasing device.

2. The circuit of claim 1, wherein the at least one first doped region is of a first conductivity type and wherein the active areas comprise a network of second doped regions of the first conductivity type and of third doped regions of a second conductivity type, each second and third region extending into the substrate from the first surface, the at least one first doped region extending at least at the level of some of the second and third regions.

3. The circuit of claim 2, comprising a fourth region of the second conductivity type extending into the substrate from the first surface, at least partially surrounding the active areas, at the level of which the first region extends, wherein the fourth region is configured to connect to an additional biasing device of the substrate.

4. The circuit of claim 1, comprising electronic components at least partly in the active areas, the components being clocked by a clock signal, and wherein the detection device comprises:
    a first unit for providing a first signal representative of said current;
    a second unit for providing a second signal which depends on the comparison of the first signal and of a third reference signal; and
    a unit for sampling the second signal at times outside of a non-zero time period following each rising edge of the clock signal.

5. The circuit of claim 4, wherein the biasing device comprises a MOS transistor and wherein the first unit comprises a resistor in series with the MOS transistor.

6. The circuit of claim 4, wherein the sampling device is capable of sampling the second signal on each falling edge of the clock signal.

7. An electronic system comprising a first integrated circuit of any of the foregoing claims, a second integrated circuit separate from the first integrated circuit, and at least one connection connecting the first integrated circuit to the second integrated circuit.

8. A method for manufacturing an integrated circuit comprising a substrate having first and second opposite surfaces and a protection device configured to protect the integrated circuit against laser attacks, the method comprising acts of:
forming at least one first doped region in the substrate;
forming active areas extending into the substrate from the first surface, wherein the active areas comprise a plurality of wells, the at least one first doped region being located below at least two of the plurality of wells;
forming a biasing device configured to bias the at least one first doped region; and
forming a device for detecting an increase in the current provided by the biasing device.

9. The method of claim 8, further comprising:
forming the at least one first doped region by a first implantation of dopants of a first conductivity type at a first power; and
forming the active areas by a network of second doped regions of the first conductivity type and of third doped regions of a second conductivity type, the at least one first doped region extending at least at the level of some of the second and third regions, the second regions being formed by a second implantation of dopants of the first conductivity type at a second power lower than the first power.

10. A method of protecting an integrated circuit from a laser attack, the method comprising:
providing in a substrate, at least one protection shield configured to capture electrons photogenerated during the laser attack, wherein the at least one protection shield extends under at least two wells formed in the substrate.

11. The method of claim 10, further comprising:
detecting a variation in at least one electric quantity generated by the at least one protection shield in response to the laser attack.

12. The method of claim 11, wherein the at least one electric quantity is a current.

13. The method of claim 11, wherein detecting a variation in at least one electric quantity comprises detecting a durable increase in a current provided by a biasing device associated with the at least one protection shield.

14. The method of claim 11, further comprising:
transmitting an alert signal in response to detecting the variation in the at least one electric quantity.

15. The method of claim 14, further comprising:
stopping an operation of the integrated circuit in response to transmitting the alert signal.

16. The method of claim 10, further comprising:
biasing the at least one protection shield.

* * * * *